United States Patent
Burnell et al.

[11] Patent Number: 6,165,309
[45] Date of Patent: Dec. 26, 2000

[54] METHOD FOR IMPROVING THE ADHESION OF METAL FILMS TO POLYPHENYLENE ETHER RESINS

[75] Inventors: Ann Marie Burnell, Schenectady; John F. Lubera, Catskill, both of N.Y.; Terrence P. Oliver, West Lafayette, Ohio

[73] Assignee: General Electric Co., Pittsfield, Mass.

[21] Appl. No.: 09/018,615

[22] Filed: Feb. 4, 1998

[51] Int. Cl.[7] ................................................... B32B 31/20
[52] U.S. Cl. .................... 156/308.2; 525/132; 525/185
[58] Field of Search ......................... 156/308.2; 525/185, 525/132

[56] References Cited

U.S. PATENT DOCUMENTS

| | | |
|---|---|---|
| 3,149,021 | 9/1964 | Goepfert et al. . |
| 3,477,900 | 11/1969 | Soukup et al. . |
| 3,700,538 | 10/1972 | Kennedy . |
| 4,081,578 | 3/1978 | van Essen et al. . |
| 4,093,768 | 6/1978 | Cordtz et al. . |
| 4,108,925 | 8/1978 | Lee, Jr. . |
| 4,113,797 | 9/1978 | Lee, Jr. . |
| 4,124,654 | 11/1978 | Abolins et al. . |
| 4,131,598 | 12/1978 | Abolins et al. . |
| 4,147,739 | 4/1979 | Lee, Jr. . |
| 4,153,518 | 5/1979 | Holmes et al. . |
| 4,172,929 | 10/1979 | Cooper et al. . |
| 4,189,517 | 2/1980 | Shanoski et al. . |
| 4,193,849 | 3/1980 | Sato . |
| 4,228,046 | 10/1980 | Lee, Jr. . |
| 4,234,701 | 11/1980 | Abolins et al. . |
| 4,243,766 | 1/1981 | Abolins et al. . |
| 4,269,950 | 5/1981 | Abolins et al. . |
| 4,317,761 | 3/1982 | Abolins . |
| 4,404,321 | 9/1983 | Abolins et al. . |
| 4,414,173 | 11/1983 | Cobbledick et al. . |
| 4,420,509 | 12/1983 | Barrell et al. . |
| 4,444,848 | 4/1984 | Shanefield et al. . |
| 4,478,979 | 10/1984 | Abolins et al. . |
| 4,524,089 | 6/1985 | Hague et al. . |
| 4,568,413 | 2/1986 | Toth et al. . |
| 4,582,564 | 4/1986 | Shanefield et al. . |
| 4,661,560 | 4/1987 | Abolins et al. . |
| 4,661,561 | 4/1987 | Abolins et al. . |
| 4,720,401 | 1/1988 | Ho et al. . |
| 4,751,268 | 6/1988 | Taubitz et al. ........................... 525/132 |
| 4,772,488 | 9/1988 | Pinch et al. . |
| 4,900,768 | 2/1990 | Abolins et al. ........................... 525/132 |
| 4,913,938 | 4/1990 | Kawakami et al. . |
| 4,916,016 | 4/1990 | Bristowe et al. . |
| 5,047,114 | 9/1991 | Frisch et al. ........................... 156/308.2 |
| 5,156,920 | 10/1992 | Aycock et al. . |
| 5,376,403 | 12/1994 | Capote et al. . |

FOREIGN PATENT DOCUMENTS

| | | |
|---|---|---|
| 046 040 | 2/1982 | European Pat. Off. . |
| 0 259 677 | 8/1987 | European Pat. Off. . |
| 0 541 171A1 | 5/1993 | European Pat. Off. . |
| 0 779 339 A2 | 12/1995 | European Pat. Off. . |
| 58-42648 | 3/1983 | Japan ................................... 525/132 |
| 61-55140 | 3/1986 | Japan ................................... 525/132 |
| 61-221257 | 10/1986 | Japan ................................... 525/132 |
| 1562540 | 3/1980 | United Kingdom . |

*Primary Examiner*—John J. Gallagher

[57] ABSTRACT

The present invention is directed to a method for improving the adhesion between a conductive laminate and a substrate material. In a preferred embodiment of the present invention, the conductive laminate is a copper film and the substrate material comprises polyphenylene ether resin. The method involves admixing a copolymer of a vinyl aromatic compound and an α,β-unsaturated cyclic anhydride with the polyphenylene ether resin. The copolymer of a vinyl aromatic compound and an α,β-unsaturated cyclic anhydride is preferably a polystyrene maleic anhydride copolymer or a rubber modified polystyrene maleic anhydride copolymer.

10 Claims, No Drawings

METHOD FOR IMPROVING THE ADHESION OF METAL FILMS TO POLYPHENYLENE ETHER RESINS

CROSS-REFERENCE TO RELATED APPLICATIONS

Not applicable.

FEDERALLY SPONSORED RESEARCH

Not applicable.

BACKGROUND OF THE INVENTION

1. Field of the Invention

The present invention relates to substrates for use in the preparation of printed circuits and the like. In particular, the present invention is directed to a method for improving the adhesion between a conductive laminate and a substrate material. In a preferred embodiment of the present invention, the conductive laminate is a copper film and the substrate material comprises polyphenylene ether resin.

2. Brief Description of the Related Art

Printed circuits are typically prepared by adhering conductive traces which form an electrical interconnect pattern onto a suitable substrate. Commonly-employed substrate materials have included epoxy-glass laminate, paper-phenolic laminate, polyimide-glass laminate, flexible polyimide films, and injection molded plastics such as liquid crystal polymers and polyphenylene sulfide resin. Copper foil has most successfully been used to form conductive traces on these substrates, in particular because of its high electrical conductivity, ready availability, and relatively low cost.

In general, metal-substrate laminates, which can be formed by forming metal by plating or by adhering a metal foil onto substrate, have a tendency to delaminate during and after the formation of a plated metal layer onto the substrate. The peel strength of many such laminates currently in use is generally felt to be insufficient for many end uses because any delamination can cause the failure of the laminate to operate in its intended use. However, even the peel strength currently achievable in many films can be still further decreased by exposure of the film to processing chemicals (etchants, cleaners, coatings, etc.) and environmental stress (such as humidity) and can be reduced to much less than 3 pounds per inch and in certain instance, can be much less than 1 pound per inch. Delamination of the metal layer can result in the failure of the material to be reflective, insulating, an adequate packaging material, or to function in a useful circuit assembled on a printed wiring board made from the laminate.

A variety of other influences can promote the delamination of metal poorly bonded to film substrate. First, the strength of the laminate bond is an important characteristic. Higher strength bonds reduce delamination tendency. Further, the mechanical stresses (soldering, film flex during processing, etc.) involved in first forming the metal on the flexible film and in subsequent processing steps can cause the film to distort or flex and can cause the poorly bonded metal to leave the film.

Additionally, a number of polymer surfaces are known to be less likely to maintain integral laminate structure. Fluorocarbon resins, polyethylene, polypropylene, and polyvinylidiene chloride or polyvinylidiene-fluoride films tend to be difficult surfaces for metal bonding.

Flexible printed circuit boards are currently one preferred circuit manufacturing format used in a variety of electronic devices. These boards are fabricated from flexible plastic substrates having a thin metal laminate layer, generally copper, and can have conductive metal on one or both surfaces with through-hole interconnections. During circuit fabrication, the metal is selectively removed by chemical etching or is pattern plated to leave a pattern of the desired interconnecting circuitry between various components in an electronic circuit. With improvements in etching technology, intercircuit line spacings approaching two-thousandths of an inch can be achieved. Narrow line spacing is one of the current technical innovations that permit continued miniaturization of complex circuitry. However, a narrow line width can promote delamination.

As a result of the problems in laminate preparations and the rigors of the laminate use, an increase in the bond strength of the metal layer to the film polymer substrate is a highly desirable end in the production of inexpensive delamination resistant metal-film laminates.

Kennedy, U.S. Pat. No. 3,700,538 discloses an adhesive used to bond copper foil to resin impregnated fiber glass cloth using a polyimide resin adhesive. The use of an adhesion promoter to bond metal to an insulating base material is also known. For example, Soukup U.S. Pat. No. 3,477,900 and Goepfert et al., U.S. Pat. No. 3,149,021 disclose that when the insulating base material comprises methylmethacrylate resin, an unsaturated polyester may be added to the resin as an adhesion promoter to bind a copper foil. However, these patents disclose that an increase in the proportion of polyester is generally accompanied by a decrease in an adhesion of the copper foil to the resinous base. Barrell et al., U.S. Pat. No. 4,420,509 and Cordts et al., U.S. Pat. No. 4,093,768 disclose procedures for preparing polyester resin copper clad laminates. These processes require several steps or expensive continuously operating equipment.

Van Essen, U.S. Pat. No. 4,081,578; Shanoski et al., U.S. Pat. No. 4,189,517 and Cobbledick et al., U.S. Pat. No. 4,414,173 are directed to in-mold coating processes which are substantially different from the present process in that a preform substrate is either made or placed in a mold and cured. The mold is opened and a small amount of resin is placed on the molded substrate-sufficient to form a coating up to about 20 mils. in thickness. The mold is then closed over the polymerizing resin to apply pressure.

Japanese Patent No. 57083-427 discloses a process where an insulation material is mounted on an inner surface of an injection mold and a metal foil is overlaid on the insulated surface and fixed. A thermoplastic resin is melt-injected into the mold to provide a resin product laminated firmly with the metal foil.

Bristowe et al, U.S. Pat. No. 4,916,016 also teaches injection molded metal-thermoset laminates.

Kawakami et al, U.S. Pat. No. 4,913,938 coating a resin substrate with a copper solution and heating in a non-oxidizing atmosphere to increase-copper laminate adhesion.

Pinch et al, U.S. Pat. No. 4,772,488 teaches the use of a carbon dioxide plasma to treat and clean dielectric layers.

Haque et al, U.S. Pat. No. 4,524,089 uses a three step plasma treatment of copper foils.

Shanefield et al., U.S. Pat. Nos. 4,444,848 and 4,582,564 teach a sputter etching of a rubber modified epoxy surface or coating.

Holmes et al, U.S. Pat. No. 4,153,518, teaches treating a refractory metal oxide layer to improve adhesion of oxide forming metals.

Toth et al, U.S. Pat. No. 4,568,413 teaches forming a releasable metallic layer on a polymeric carrier, adhering the releasable-metal onto a substrate and peeling the carrier.

Sato, U.S. Pat. No. 4,193,849 teaches conventional pretreatments of plastic prior to electrochemical deposition of metal surfaces.

Ho et al., U.S. Pat. No. 4,720,401 teaches heating a film substrate to a temperature between 0.6 and 0.8 of the curing temperature (Tc) of the substrate material, commonly an elevated temperature exceeding 200° C. (often 240–280° C.) and evaporating or sputtering metal ions such that a metal ion can interact with the heated substrate layer and penetrate into the interior of the heated substrate. The processes in Ho et al are done in an inert atmosphere and produce no metal oxide.

Fronz et al, Plasma Pretreatment of Polyimide Films, a paper presented at the Apr. 24–28, 1989 meeting of the Soc. of Vacuum. Coaters, teach many of the drawbacks of copper-polyimide laminates. Fronz et al teaches that surface cleaning of the polyimide film will increase peel strength. Fronz et al does not discuss the importance of metal-oxide adhesion structures nor uses metallic methods in the film treatment.

Capote et al., U.S. Pat. No. 5,376,403, teaches compositions comprising three or more of the following: a relatively high melting metal powder; a lower melting point metal powder; an active cross-linking agent which also serves as a fluxing agent; a resin; and a reactive monomer.

While many of the aforementioned compositions provide bulk electrical conductivities approaching that of solid copper with resistance to degradation at high temperatures and relative humidities, some of these compositions also do not exhibit entirely adequate adhesion properties when applied to many of the traditional substrate materials. Moreover, many of the processes known in the art require complicated or expensive steps and or equipment.

Accordingly, it is an object of the present invention to provide a method for enhancing the adhesion between a conductive laminate and a substrate material. In a preferred embodiment of the present invention, the conductive laminate is a copper film and the substrate material comprises polyphenylene ether resin.

SUMMARY OF THE PRESENT INVENTION

The present invention provides a method for improving the adhesive strength between a conductive laminate and a substrate material, the method comprising addition of an amount of a copolymer of a vinyl aromatic compound and an α,β-unsaturated cyclic anhydride to the substrate material wherein the amount of the copolymer is effective to afford an improved adhesive strength between the conductive laminate and substrate material. In a preferred embodiment of the present invention, the conductive laminate is a copper film and the substrate material comprises polyphenylene ether resin and the copolymer of a vinyl aromatic compound and an α,β-unsaturated cyclic anhydride is a polystyrene-maleic anhydride copolymer. In an especially preferred embodiment, the amount of copolymer is sufficient to result in an adhesive strength of at least about 5 psi with a 90° pull.

DETAILED DESCRIPTION OF THE PREFERRED EMBODIMENTS

The present invention includes a process for manufacturing metal-plastic laminates which are useful as electrical circuit boards, EMI/RFI shielding components, and other applications. Preferred metals for use in forming the laminate structures of the invention include aluminum, copper, gold, silver, etc. Copper is usually preferred. Electrical circuit boards usually employ a copper foil which is subsequently etched away to leave behind portions of metal foil as electrical conductors. The foil thickness is customarily measured in terms of the number of ounces of metal per square foot of the foil. Customarily electrical circuit boards employ foil having one ounce per square foot or two ounces per square foot thicknesses. One surface of the copper foil preferably has a surface roughness against which the polyester resin is molded. The other surface of the foil customarily is shiny bright.

The copper foil usually is about 0.0005 to about 0.003 inch thick foil with one surface oxidized to enhance bonding between the copper foil and substrates. Other thicknesses are also useful. The copper foil is commonly placed in a cavity with the oxidized surface facing away from the mold surface. A test specimen made of the compositions of the present invention is placed against the copper foil and pressure and heat are applied for short time periods. The exact conditions are readily determined by one of skill in this art without undue experimentation and will vary according to many factors. Some of the factors include, for example, the composition of the substrate, the thickness of the specimen, the cycle time desired, etc. The temperature is, however, limited by the composition and geometry of the specimen to avoid distortion or melting of the specimen. The adhesion of the metal foil to the substrate can be determined.

Polyphenylene ether resins are a well known class of compounds sometimes referred to as polyphenylene oxide resins. Examples of suitable PPE and processes for their preparation can be found in, for example, U.S. Pat. Nos. 3,306,874; 3,306,875; 3,257,357; and 3,257,358. Compositions of the present invention will encompass homopolymers, copolymers and graft copolymers obtained by the oxidative coupling of phenolic compounds. The preferred PPE used in compositions of the present invention are derived from 2,6-dimethyl phenol. Also contemplated are PPE copolymers derived from 2,6-dimethyl phenol and 2,3,6-trimethyl phenol.

Useful PPE include poly(2,6-dimethyl-1,4-phenylene ether) resin having an intrinsic viscosity (I.V.) of between about 0.15 and about 0.60 dl/g as measured in toluene at 25° C. and a concentration of 0.6 gram per 100 ml. In a preferred embodiment of the invention, the PPE have an intrinsic viscosity (I.V.) of between about 0.35 and about 0.50 dl/g as measured in toluene at 25° C. and a concentration of 0.6 gram per 100 ml.

Copolymers of a vinyl aromatic compound and an α,β-unsaturated cyclic anhydride are well known in the art and have been described in the literature. In general, they are prepared by conventional bulk solution or emulsion techniques using free-radical initiation. For example, styrene-maleic anhydride copolymers can be obtained by simply reacting the two monomers, i.e., styrene and maleic anhydride, at 50° C. in the presence of benzoyl peroxide. The rate of polymerization may be better controlled if a solvent such as acetone, toluene, or xylene is used.

The vinyl aromatic compound can be derived from compounds of the formula: (I)

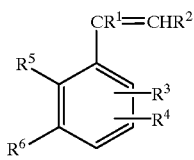

(I)

wherein $R^1$ and $R^2$ are selected from the group consisting of (lower) alkyl or alkenyl groups of from 1 to 6 carbon atoms and hydrogen; $R^3$ and $R^4$ are selected from the group consisting of chloro, bromo, hydrogen, and (lower) alkyl of from 1 to about 6 carbon carbon atoms; $R^5$ and $R^6$ are selected from the group consisting of hydrogen and (lower) alkyl and alkenyl groups of from 1 to about 6 carbon atoms or $R^5$ and $R^6$ may be concatenated together with hydrocarbyl groups to form a naphthyl group. These compounds are free of any substituent that has a tertiary carbon atom. Styrene is the preferred vinyl aromatic compound.

The α,β-unsaturated cyclic anhydride can be represented by the formula:

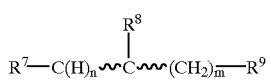

(II)

wherein the wavy lines represent a single or a double carbon to carbon bond, $R^7$ and $R^8$ taken together represents a

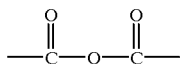

linkage, $R^9$ is selected from the group consisting of hydrogen, vinyl, alkyl, alkenyl, alkyl-carboxylic or alkenyl-carboxylic of from 1 to 12 carbon atoms, n is 1 or 2, depending on the position of the carbon—carbon double bond, and m is an integer of from 0 to about 10. Examples include maleic anhydride, citraconic anhydride, itaconic anhydride, aconitic anhydride, and the like.

The preparation of these copolymers is described in U.S. Pat. Nos. 2,971,939; 3,336,267 and 2,769,804, the disclosures of which are incorporated herein by reference.

The copolymers include rubber-modified copolymers. The rubber employed in preparing the rubber-modified copolymers of a vinyl aromatic compound and an α,β-unsaturated cyclic anhydride can be a polybutadiene rubber, butyl rubber, styrene-butadiene rubber, acrylonitrile rubber, ethylene-propylene copolymers, natural rubber, EPDM rubbers and the like.

The preparation of rubber-modified copolymers of a vinyl aromatic compound and an α,β-unsaturated cyclic anhydride is described in U.S. Pat. Nos. 4,147,739; 4,228,046; 4,661,561; and 5,539,036, which are all incorporated herein by reference.

The copolymers of a vinyl aromatic compound and an α,β-unsaturated cyclic anhydride can comprise from 40 to 1 parts by weight of the α,β-unsaturated cyclic anhydride, from 60 to 99 parts by weight of a vinyl aromatic compound and from 0 to 25 parts by weight of rubber. The preferred polymers will contain about 25–5 parts by weight of the α,β-unsaturated cyclic anhydride, 75–95 parts by weight of the vinyl aromatic compound, and 10 parts by weight of rubber.

A preferred unmodified vinyl aromatic α, β-unsaturated cyclic anhydride copolymer useful in the composition of this invention is Dylark 232, commercially available from Arco Polymers. Dylark 232 is a styrene-maleic anhydride copolymer containing about 11% maleic anhydride, the balance being styrene. A preferred rubber-modified vinyl aromatic α,β-unsaturated cyclic anhydride copolymer is Dylark 240, which is also available from Arco Polymers. Dylark 240 is a high impact styrene-maleic anhydride copolymer containing 9–10% rubber and 9% maleic anhydride, the balance being styrene.

The amount of the copolymer of a vinyl aromatic compound and an α,β-unsaturated cyclic anhydride present in the present compositions is an effective amount to increase the adhesion between a conductive laminate and the surface of a specimen made from the composition. In a preferred embodiment of the invention, the peel strength should be at least 5 psi after a lamination cycle of 1000 psi for thirty minutes at 180° C. In an especially preferred embodiment of the invention, the peel strength should be at least 6 psi after a lamination cycle of 1000 psi for thirty minutes at 180° C. Generally the amount of the copolymer is between about 1% and 15% by weight, preferably between about 2% and 12%, wherein all weights are weight percentages based upon the total weight of the composition.

The compositions of the present invention optionally contain an organic phosphate that imparts enhanced flame retardant properties to the compositions amongst other enhanced properties. Organic phosphates are well known in the art as evidenced by UK Patent Application GB 204308383, published on October 1, 1980, as well as U.S. Pat. Nos. 4,355,126; 4,900,768; 5,455,292; and 5,461,096, all of which are hereby incorporated by reference. Useful phosphates include those of the general formula (III):

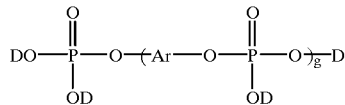

wherein each D is independently a lower alkyl group of about $C_{1-8}$ or an aryl group or alkyl substituted aryl group, Ar is an aryl group or an alkyl substituted aryl group, and g is an integer from 0 to about 10. Acid levels are preferred to be less than an acid number of 0.10 (equivalent mg KOH/g). In one embodiment of the present invention, D is preferably phenyl; Ar is preferably phenyl, and g is preferably 0 or 1. In another preferred embodiment, the phosphate is a mixture of phosphates wherein the phosphate comprises a resorcinol based phosphate (i.e. Ar is a residue of resorcinol) wherein D is phenyl, and g is on average between 0 and 5. In another preferred embodiment, Ar is a residue of bisphenol-A, D is phenyl, and g is on average between 0 and 5. When g is zero, the preferred phosphate is triphenylphosphate. Mixtures of triphenyl phosphate and other higher molecular weight phosphates are utilized to balance such properties as flow, flame retardancy, heat distortion, and cost.

When utilized, the amount of organic phosphate present in the compositions of the present invention is an amount effective to impart a flame rating of V-1 or better in the UL-94 flame test as measured at 0.125 inch thickness. Generally the amount of phosphate is between about 2% and 15% by weight, preferably between 4% and 12% by weight, and most preferably between about 5% and 10% by weight, wherein the weight percentage is based upon the total weight of the composition.

Another optional component of the invention is non-fibrous fillers. The non-fibrous fillers are mineral components that can be selected, for instance, from among talcs, clays, micas, metal sulfates, calcium carbonates and various silicates. These minerals typically have a small average particle size, generally under about 40 microns in size, preferably under about 20 microns and most preferably under about 15 microns. The minerals may be used alone or as a mixture of minerals. The minerals may also contain various surface treatments. Fine particle talcs and clays having an average particle sizes under about 20 microns are the preferred minerals.

When utilized, the amount of the mineral filler based upon the entire weight of the composition is generally between about 2% and 50% by weight. The exact amount will depend in large part on the properties desired in the final specimen or part. Typically, preferred amounts range from about 15% to 35% by weight based upon the entire weight of the composition.

The minerals may optionally be used in combination with polytetrafluoroethylene resin, which are commercially available or can be prepared by conventional means. They are normally white solids which are obtained, for example, by polymerizing tetrafluorethylene in aqueous media in the presence of a free radical catalyst at a pressure of from about 100 to about 1,000 psi and at a temperature of from about 32° F. to about 400° F. A preferred commercially available polytetrafluoroethylene resin from ICI under the trademark WITCON and sold as TL-155.

The compositions of the present invention may also contain at least one impact modifier. The preferred impact modifiers are block (typically diblock, triblock or radial teleblock) copolymers of alkenyl aromatic compounds and dienes. Most often at least one block is derived from styrene and at least one block from at least one of butadiene and isoprene. Especially preferred are the triblock and diblock copolymers comprising polystyrene blocks and diene derived blocks wherein the aliphatic unsaturation has been preferentially removed with hydrogenation. Mixtures of various copolymers are also sometimes useful. The weight average molecular weights of the impact modifiers are typically in the range of about 50,000 to 300,000. Block copolymers of this type are commercially available from Shell Chemical Company under the trademark KRATON, and include D1101, D1102, G1650, G1651, G1652, G1701 and G1702.

The amount of the impact modifier generally present will vary upon the impact levels which are desired as well as the constraints by the remaining physical properties. Generally, when present the impact modifier is used in the range of about 1% to about 15% by weight based on the total weight of the composition. The preferred range is about 1% to about 5% by weight based on the total weight of the composition.

The compositions of the present invention may also optionally contain at least one non-elastomeric polymer of an alkenyl aromatic compound. Suitable polymers of this type may be prepared by methods known in the art including bulk, suspension and emulsion polymerization. They generally contain at least 25% by weight of structural units derived from an alkenyl aromatic monomer of the formula (VII)

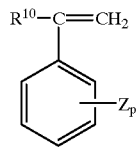

(VII)

wherein $R^{10}$ is hydrogen, lower alkyl or halogen; Z is vinyl, halogen or lower alkyl; and p is from 0 to 5. These resins include homopolymers of styrene, chlorostyrene and vinyltoluene, random copolymers of styrene with one or more monomers illustrated by acrylonitrile, butadiene, α-methylstyrene, ethylvinylbenzene, divinylbenzene and maleic anhydride, and rubber-modified polystyrenes comprising blends and grafts, wherein the rubber is a polybutadiene or a rubbery copolymer of about 98–78% styrene and about 2–32% diene monomer. These rubber modified polystyrenes include high impact polystyrene (commonly referred to as HIPS). Non-elastomeric block copolymer compositions of styrene and butadiene can also be used that have linear block, radial block or tapered block copolymer architectures. They are commercially available from Fina Oil under the trademark FINACLEAR resins and from Phillips 66 under the trademark K-RESINS.

The amount of the non-elastomeric polymer of an alkenyl aromatic compound, when one is used, is in the range of up to about 50% by weight based on the total weight of the composition. The preferred range, based on the total weight of the composition, is from about 1% to about 35% by weight, and the most preferred range is about 1% to about 20% by weight based on the total weight of the composition.

Compositions of the present invention can also optionally include effective amounts of at least one additive selected from the group consisting of anti-oxidants, drip retardants, dyes, pigments including carbon black, colorants, stabilizers, antistatic agents, plasticizers and lubricants. These additives are known in the art, as are their effective levels and methods of incorporation. Effective amounts of the additives vary widely, but they are usually present in an amount up to about 50% or more by weight, based on the weight of the entire composition. Especially preferred additives include hindered phenols, thio compounds and amides derived from various fatty acids. In one preferred embodiment of the present invention, a combination of zinc oxide and zinc sulfide is utilized. The preferred amounts of these additives generally range up to about 2% total combined weight based on the total weight of the composition.

The preparation of the compositions of the present invention is normally achieved by merely blending the ingredients under conditions for the formation of an intimate blend. Such conditions often include mixing in single or twin screw type extruders or similar mixing devices which can apply a shear to the components. It is often advantageous to apply a vacuum to the melt through a vent port in the extruder to remove volatile impurities in the composition. Those of ordinary skill in the art will be able to adjust blending times and temperatures, as well as component addition, without undue additional experimentation.

It is not certain whether any or all of the components in these compositions interact chemically upon blending. Therefore, the invention includes compositions comprising the above recited components and any reaction products thereof as well as any other optional components.

It should also be clear that improved molded articles, such as improved circuit boards, prepared from the processes and compositions of the present invention represent an additional embodiment of this invention.

The following examples are provided to illustrate some embodiments of the present invention. They are not intended to limit the invention in any aspect. All percentages are by weight based on the total weight of the entire composition, unless otherwise indicated. All parts are parts by weight.

EXAMPLES

In the following examples illustrating the inventions, the blend constituents used were as follows:

PPE: a poly(2,6-dimethyl-1,4-phenylene ether) resin having an intrinsic viscosity in chloroform at 23° C. of about 0.46 dl/gm.

SMA: a polystyrene-maleic anhydride copolymer commercially available from Arco Polymers sold under the grade DYLARK 250.

RDP: a tetraphenyl resorcinol diphosphate

HIPS: Huntsman Chemicals Co. 1897 rubber modified polystyrene.

Clay: clay having an average particle size under about 20 microns.

Adds: about a 1:1 weight: weight mixture of zinc oxide and zinc sulfide.

CB: pigment carbon black

The compositions of Table 1 were extruded on a Werner-Pfleiderer twin-screw extruder capable of multiple feed and venting locations using a barrel set temperature of about 550° F. and a vacuum of about 10–20 inches Hg applied to at least one vent port. All the ingredients were fed into the feed throat of the extruder, heated and intimately admixed with a vacuum applied to the melted material through a vacuum vent. The extrudate was chopped into pellets, dried and extruded into about 30 mil sheet using a barrel set temperature of about 540° F.

Copper foil, one ounce ED foil, was laminated onto the sheet and tested for adhesive strength. The lamination conditions were 410° F. at 150 psi for 30 minutes with a 36 in$^2$ surface area. Adhesion results were determined with a 90° pull.

|  | 1 | 2 | 3 | 4 | 5 | 6 |
|---|---|---|---|---|---|---|
| PPE | 58.2 | 57.2 | 58.2 | 50.2 | 53.2 | 66.2 |
| SMA | 8 | 12 | 16 | 16 | 4 | 0 |
| HIPS | 0 | 0 | 0 | 0 | 12 | 0 |
| RDP | 8 | 5 | 0 | 8 | 5 | 8 |
| Clay | 25 | 25 | 25 | 25 | 25 | 25 |
| Adds | 0.3 | 0.3 | 0.3 | 0.3 | 0.3 | 0.3 |
| CB | 0.5 | 0.5 | 0.5 | 0.5 | 0.5 | 0.5 |
| peel strength (psi) | 7.64 | 7.75 | 7.85 | 7.58 | 7.94 | 1.8 |

As seen by these data, addition of a copolymer of a vinyl aromatic compound and an α,β-unsaturated cyclic anhydride resulted in an unexpected increase in the adhesive strength of a metal foil onto the plastic substrate. For example, composition 6 is a control containing no copolymer and exhibited an adhesive strength of only 1.8 psi. In contrast, compositions 1 to 5 all contain varying levels of a copolymer and all exhibited at least about four times the adhesive strength. A minimum value of at least about 5 psi is important for many commercially useful applications.

What is claimed:

1. A method of increasing the adhesive strength between a metal foil and a substrate containing polyphenylene ether resin wherein said method comprises contacting the metal foil with the substrate and subjecting the layers so formed to laminating conditions of heat and pressure, wherein the substrate comprises (i) a copolymer of a vinyl aromatic compound and an α,β-unsaturated cyclic anhydride admixed with (ii) the polyphenylene ether resin.

2. The method of claim 1, wherein the copolymer of a vinyl aromatic compound and an α,β-unsaturated cyclic anhydride is a polystyrene-maleic anhydride copolymer or a rubber modified polystyrene-maleic anhydride copolymer.

3. The method of claim 1, wherein the method further comprises admixing a non-fibrous filler with the polyphenylene ether resin.

4. The method of claim 1, wherein the method further comprises admixing an organic phosphate with the polyphenylene ether resin.

5. The method of claim 1, wherein the method further comprises admixing a non-fibrous filler and an organic phosphate with the polyphenylene ether resin.

6. The method of claim 5, wherein the non-fibrous filler is clay or talc.

7. The method of claim 5, wherein the organic phosphate has the formula

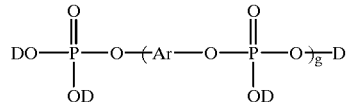

wherein each D is phenyl, Ar is a residue of resorcinol or bisphenol-A, and g is on average between 0 and 5.

8. The method of claim 1, wherein the adhesive strength between the metal foil and the substrate is least 5 psi after a lamination cycle of 1000 psi for thirty minutes at 180° C.

9. The method of claim 1, wherein the adhesive strength is least 5 psi after a lamination cycle of 1000 psi for thirty minutes at 180° C.

10. The method of claim 1, wherein the copolymer of a vinyl aromatic compound and an α,β-unsaturated cyclic anhydride is present in amount between about 1% and 15% by weight based upon the total weight of the composition.

* * * * *